(12) United States Patent
Furuta

(10) Patent No.: US 8,462,038 B2
(45) Date of Patent: Jun. 11, 2013

(54) A/D CONVERTER AND RADIO RECEIVER

(75) Inventor: Masanori Furuta, Odawara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/409,841

(22) Filed: Mar. 1, 2012

(65) Prior Publication Data

US 2013/0051501 A1  Feb. 28, 2013

(30) Foreign Application Priority Data

Aug. 29, 2011 (JP) ................................. 2011-186130

(51) Int. Cl.
*H03M 1/34* (2006.01)
(52) U.S. Cl.
USPC ............................ 341/162; 341/110; 341/155
(58) Field of Classification Search
USPC ................... 375/340; 341/110, 155, 162, 158, 341/172, 163
See application file for complete search history.

(56) References Cited

U.S. PATENT DOCUMENTS

| | | | | |
|---|---|---|---|---|
| 5,684,487 A | * | 11/1997 | Timko | 341/172 |
| 6,583,745 B2 | * | 6/2003 | Sakakibara et al. | 341/155 |
| 6,664,911 B2 | * | 12/2003 | Hirai | 341/159 |
| 6,717,542 B2 | | 4/2004 | Harada | |
| 7,439,898 B1 | * | 10/2008 | Nittala et al. | 341/163 |
| 7,876,254 B2 | * | 1/2011 | Berens et al. | 341/163 |
| 2002/0008654 A1 | * | 1/2002 | Sakakibara et al. | 341/162 |
| 2003/0098808 A1 | * | 5/2003 | Hirai | 341/155 |
| 2008/0129573 A1 | * | 6/2008 | Mueck et al. | 341/163 |
| 2010/0079327 A1 | * | 4/2010 | Berens et al. | 341/158 |

FOREIGN PATENT DOCUMENTS

JP 2003-283336 A 10/2003

OTHER PUBLICATIONS

Franz Kuttner: "A 1.2V 10b 20MSample/s Non-Binary Successive Approximation ADC in 0.13 μm CMOS"; 2002 IEEE International Solid-State Circuits Conference.

* cited by examiner

*Primary Examiner* — Jean B Jeanglaude
(74) *Attorney, Agent, or Firm* — Holtz, Holtz, Goodman & Chick, P.C.

(57) ABSTRACT

There is provided a successive-approximation A/D converter in which the binary weighted capacitive D/A converter generates a residual signal for each of cycles assigned to each bit of N bits on the basis of an analog input signal and a reference voltage, the first comparator compares a residual signal at a first time point within a cycle with a predetermined voltage to acquire a first comparison result, the register stores the first comparison result therein, the second comparator compares a residual signal at a second time point later than the first time point within the cycle with the predetermined voltage to acquire a second comparison result, the error determining circuit generates an error detection signal when they differ from each other, and the error-correcting circuit inverts and outputs the first comparison result from the register in a case that the error detection signal has been generated.

8 Claims, 13 Drawing Sheets

US 8,462,038 B2

A/D CONVERTER AND RADIO RECEIVER

CROSS REFERENCE TO RELATED APPLICATIONS

This application is based upon and claims the benefit of priority from the prior Japanese Patent Application No. 2011-186130, filed on Aug. 29, 2011, the entire contents of which are incorporated herein by reference.

FIELD

Embodiments relate to a successive-approximation A/D (analog-to-digital) converter and a radio receiver.

BACKGROUND

The task of speeding up a successive approximation (SAR) A/D converter is to reduce the power consumption of a driver for driving a capacitive D/A converter. The cause for an increase in power consumption is nothing less than the necessity of shortening the settling time of the capacitive D/A converter along with the speeding up. In response to this task, there has been proposed a successive-approximation A/D converter based on a non-binary conversion algorithm. This A/D converter adopts a system in which a comparison voltage of A/D conversion is given redundancy in each conversion cycle. By having redundancy, the A/D converter is capable of making corrections in later digital processing even if settling is more or less insufficient.

In A/D conversion based on a non-binary algorithm, a radix is 2 or smaller. Accordingly, whereas a resolution of N bits can be obtained by N cycles of A/D conversion in a binary algorithm, the number of cycles larger than N is required in the case of the non-binary algorithm, in order to obtain a resolution of N bits. An error margin of the comparison voltage becomes larger in proportion to the amount of redundancy. Likewise, the number of conversion cycles increases with an increase in the amount of redundancy. Accordingly, the non-binary algorithm is disadvantageous in that an error tolerance in the algorithm decreases in contrast to a given amount of redundancy.

The non-binary algorithm is also disadvantageous in that a digital signal processing circuit needs to be provided in the A/D converter since the result of A/D conversion has to be converted to a binary system.

DETAILED DESCRIPTION

According to an embodiment, there is provided a successive-approximation A/D converter, including: a binary weighted capacitive D/A converter, a first comparator, a register, a second comparator, an error determining circuit and an error-correcting circuit.

The binary weighted capacitive D/A converter generates a residual signal for each of cycles assigned to each bit of N bits on the basis of an analog input signal and a reference voltage.

The first comparator compares a residual signal at a first time point within a cycle with a predetermined voltage to acquire a first comparison result representative of a logical value.

The register stores the first comparison result therein.

The second comparator compares a residual signal at a second time point later than the first time point within the cycle with the predetermined voltage to acquire a second comparison result representative of a logical value.

The error determining circuit generates an error detection signal when the first comparison result differs from the second comparison result.

The error-correcting circuit inverts, in a case that the error detection signal has been generated, the first comparison result from the register to output an inverted first comparison result, and output, in a case that the error detection signal has not been generated, the first comparison result from the register, without inverting the first comparison result.

Hereinafter, embodiments of the present invention will be described, while referring to the accompanying drawings.

Figure 1:
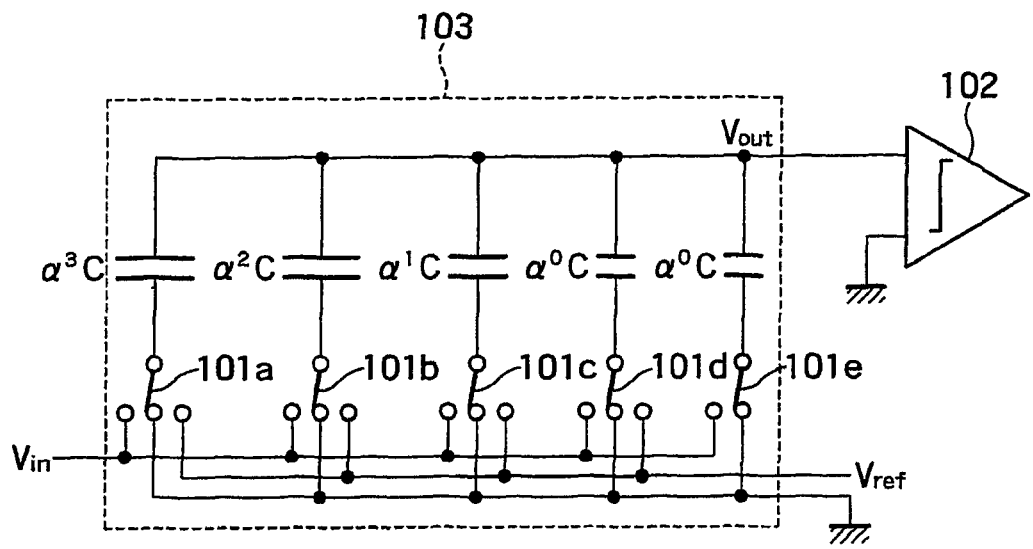
FIG. 1 is a drawing illustrating a SARAD converter according to a related art.

FIG. 1 illustrates a SARAD converter according to a related art.

This circuit includes a plurality of capacitors $\alpha^3 C$, $\alpha^2 C$, $\alpha^1 C$, $\alpha^0 C$ and $\alpha^0 C$ weighted by powers of $\alpha$; and a plurality of switches 101a, 101b, 101c, 101d and 101e respectively connected to one end of each capacitor; and a comparator 102. This circuit is a configuration example in which a resolution N=3 bits. Reference numeral 103 denotes a capacitive D/A converter.

A general formula of the internal amplitude ($V_{out}$), i.e., the residual signal of this SARAD converter is represented by the following formula:

$$V_{out} = -V_{in} + \frac{1}{\alpha^3 + \alpha^2 + \alpha^1 + \alpha^0 + \alpha^0}(\alpha^3 D[2] + \alpha^2 D[1] + \alpha^1 D[0])V_{ref} \quad \text{[Formula 1]}$$

Here, D[i] represents an A/D conversion result in an N-ith cycle. For example, if N=3, then D[2] represents an A/D conversion result in a cycle of 3−2=1. D[i] has a logical value of 0 or 1.

$V_{ref}$ represents the reference voltage of the A/D converter (input range of the A/D converter).

The comparator 102 compares $V_{out}$ with a ground (Vg), and outputs 1 if $V_{out}$ is larger, or outputs 0 if $V_{out}$ is smaller.

A case is considered in which, for example, $\alpha=2$, in order to describe basic A/D conversion operation.

In a first cycle, $V_{ref}$ is connected to a $2^3$ capacitor and the ground (Vg) is connected to other capacitors. The comparator 102 compares $V_{out}$ with Vg to perform A/D conversion.

$V_{out}$ ($V_{out}$ (1)) in the first cycle is given by the following formula:

$$V_{out} = -V_{in} + \frac{1}{2}V_{ref} \qquad \text{[Formula 2]}$$

At this time, the conversion result D[2] is 1 if an input signal ($V_{out}$–Vg) to the comparator 102 is positive, or 0 if the input signal is negative.

In a second cycle of conversion, $V_{ref}$ is connected to a $2^2$ capacitor, Vg is connected to a $2^1$ capacitor and two $2^2$ capacitors, and a voltage of $V_{ref}*D[2]$ is connected to the $2^3$ capacitor, respectively, to perform A/D conversion operation by using the comparator 102. $V_{out}$ ($V_{out}$ (2)) at this time is represented by the following formula:

$$V_{out} = -V_{in} + \frac{1}{2}V_{ref}D[2] + \frac{1}{4}V_{ref} \qquad \text{[Formula 3]}$$

Such computations as described above are repeated to realize high-resolution A/D conversion operation.

Figure 2:
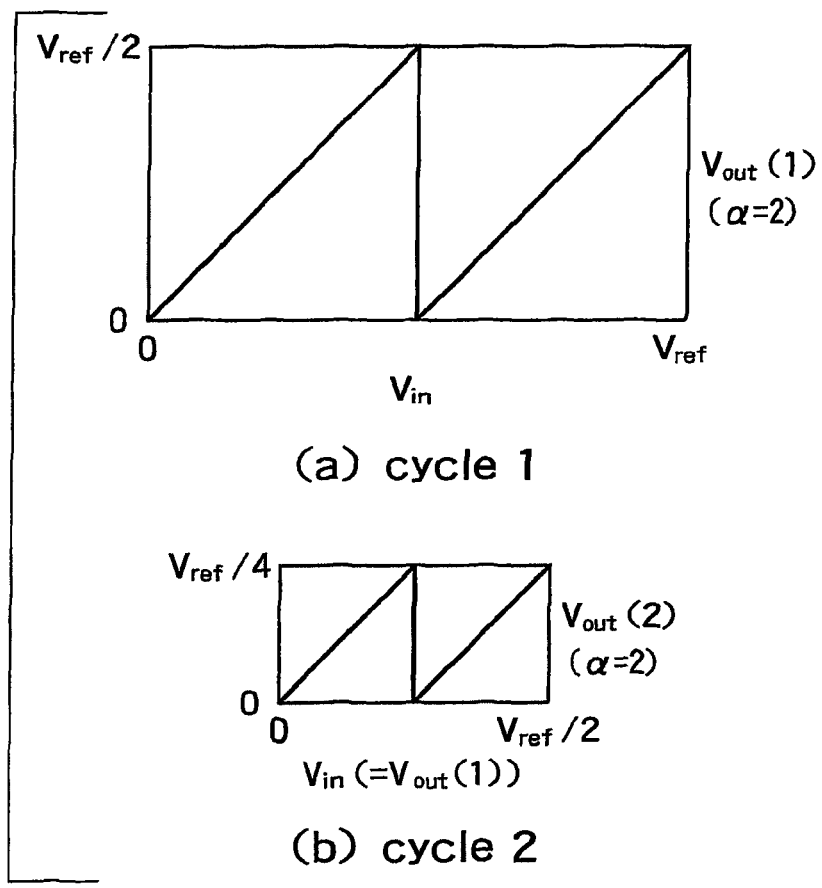
FIG. 2 is a drawing illustrating an example of the input-output characteristics of an A/D converter when α=2.

FIG. 2 illustrates the input-output characteristics of the A/D converter when $\alpha=2$. FIG. 2A illustrates the input-output characteristics in a first cycle of SARAD conversion, whereas FIG. 2B illustrates the input-output characteristics in a second cycle. The axis of abscissas represents an input Vin to the A/D converter, and the axis of ordinates represents $V_{out}$. If the comparison voltage (residual signal) $V_{out}$ can be precisely set to, for example, ½ or ¼ of $V_{ref}$, the input signal is A/D-converted without causing errors.

In practice, however, consideration needs to be given to the settling time of the capacitive D/A converter 103.

Figure 3:
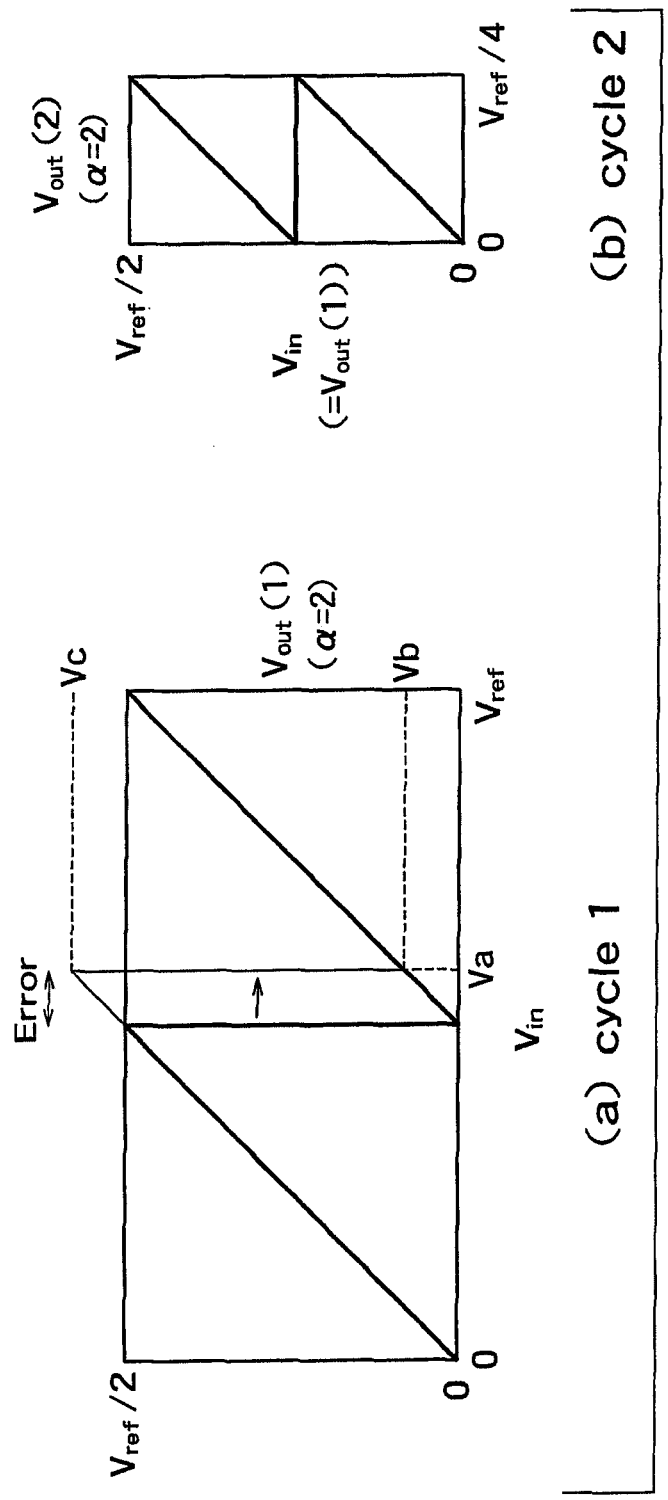
FIG. 3 is a drawing illustrating the input-output characteristics when the settling time of a capacitive DAC is insufficient.

FIG. 3 illustrates the input-output characteristics when the settling time of the capacitive DAC is insufficient. FIG. 3A illustrates the input-output characteristics in a first cycle, whereas FIG. 3B illustrates the input-output characteristics in a second cycle.

Insufficiency in settling corresponds to a decrease in the added amount to reference voltage. Accordingly, the reference voltage is subtracted in a case that a voltage of the input signal is larger than $V_{ref}/2$. For example, as illustrated in FIG. 3A, an output is desired to be $V_b$ when an input is $V_a$, but results in $V_c$. If an error occurs in the comparison voltage, the output voltage ($V_{out}$ (1)) in the first cycle exceeds the input range of the second cycle (in the illustrated example, $V_c$ is larger than $V_{ref}/2$), thus causing miscoding. Note that the drawing of FIG. 3B is rotated 90 degrees, in order to clarify a magnitude relationship between $V_{out}$ (1) in the first cycle and Vin in the second cycle in FIG. 3B.

Examples of techniques to alleviate effects of insufficient settling include a method of setting $\alpha$ to a value smaller than 2. This method will be discussed hereinafter.

Figure 4:
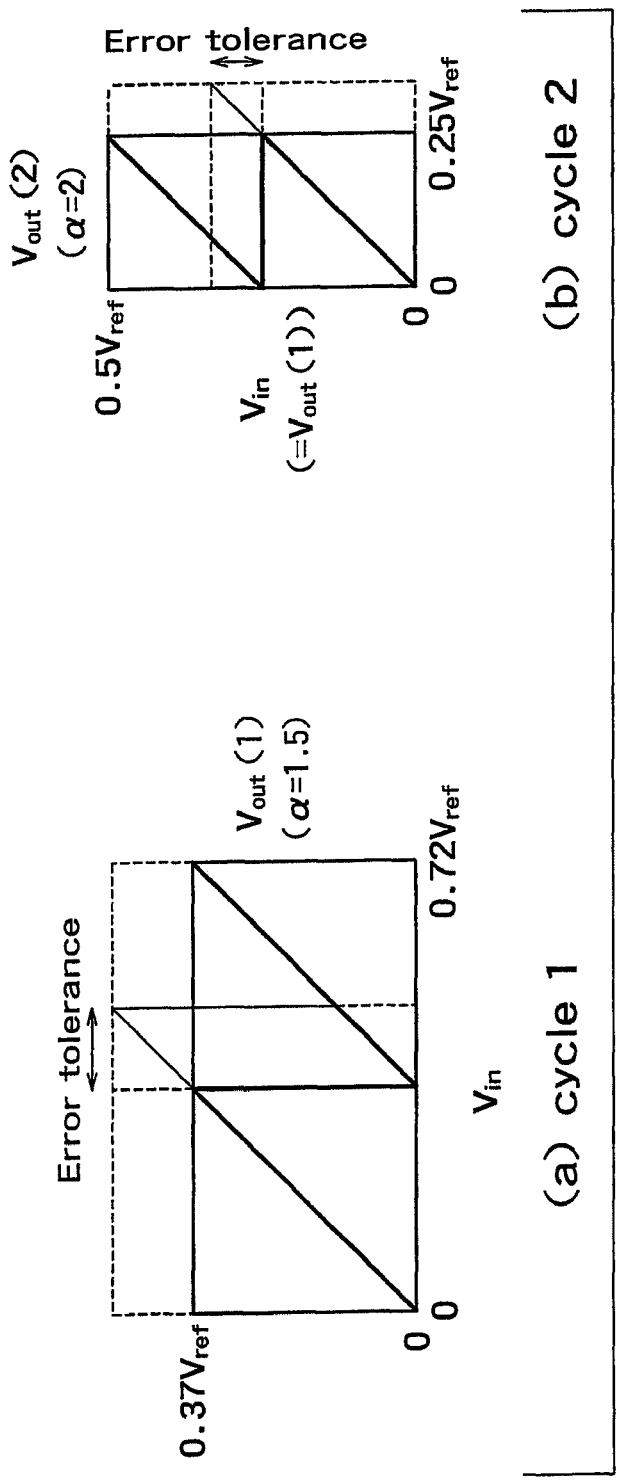
FIG. 4 is a drawing illustrating an example of the input-output characteristics of the A/D converter when α=1.5.

As an example of this method, FIG. 4 illustrates input-output characteristics when $\alpha=1.5$. FIG. 4A illustrates input-output characteristics in a first cycle, whereas FIG. 4B illustrates input-output characteristics in a second cycle.

When $\alpha=1.5$, the output signal (residual signal) of the capacitive D/A converter is represented by the following general formula:

$$V_{out} = \qquad \text{[Formula 4]}$$
$$-V_{in} + \frac{3.375}{9.125}V_{ref}D[2] + \frac{2.25}{9.125}V_{ref}D[1] + \frac{1.5}{9.125}V_{ref}D[0]$$

Solid lines in FIG. 4A represent an input/output range of the first cycle in a state free of errors, and dotted lines (range in a direction of the axis of ordinates) represent an input range of the second cycle. The input range of the second cycle tolerates a range equal to or greater than the output range of the first cycle free of errors. Consequently, any error in the comparator is tolerated as long as the error does not exceed the range shown by the dotted lines.

Note however that an output code decreases in this A/D conversion algorithm. If $\alpha=1.5$ and the number of cycles is 3, then the output code is a $1.5^2+1.5^1+1.5^0=5.75$ (5, if truncated) code. This value is approximately 0.7 times, compared with an output code (8 code) when $\alpha=2$. If expressed by the accuracy of an A/D converter, the output code is 3 bits for $\alpha=2$ and 2.5 bits for $\alpha=1.5$, when the number of cycles is 3, thus resulting in a decrease of 0.5 bits. In order to compensate for this decrease, the number of cycles needs to be increased. For example, in a case where a conversion code of 3 bits or greater is obtained when $\alpha=1.5$, an addition of one cycle gives a 9.1 (9, if truncated) code. Thus, it is understood that four cycles are required, whereas 3 cycles are sufficient otherwise.

In addition, in the case of a non-binary A/D converter, conversion to a binary code is required. For example, a computation of $(2/1.5)^2D[2]+(2/1.5)D[1]$ needs to be performed when $\alpha=1.5$. For this reason, a multiplying circuit becomes necessary as a digital signal processing circuit, thus causing the problem that a circuit area and power consumption increase.

Figure 5:
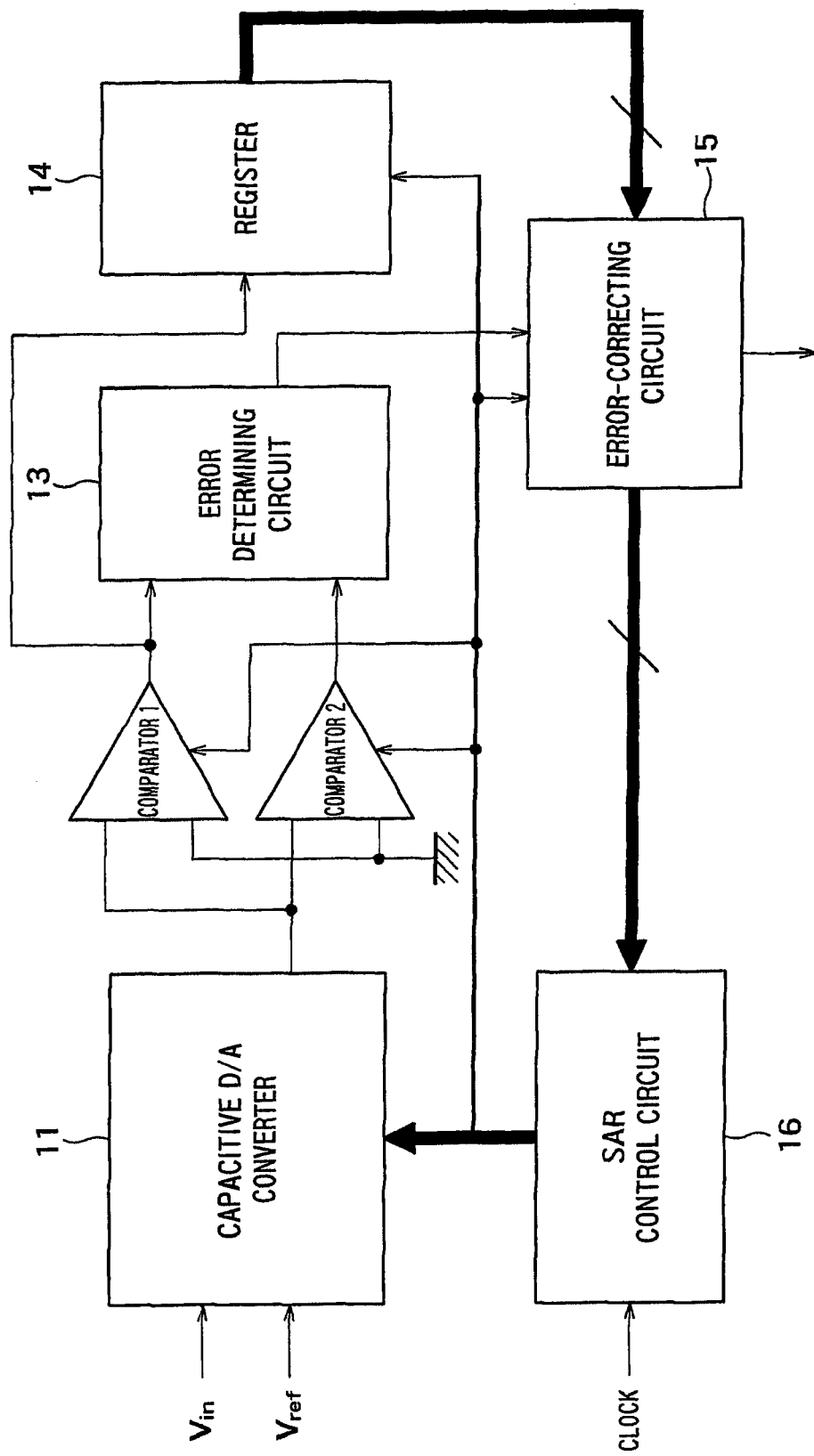
FIG. 5 is a drawing illustrating a SARAD converter according to a first embodiment.

FIG. 5 illustrates a SARAD converter according to a first embodiment configured to solve the above-described problems.

This SARAD converter includes a capacitive D/A converter 11, two comparators 1 and 2, an error determining circuit 13, a register 14, an error-correcting circuit 15, and an SAR control circuit 16.

The capacitive D/A converter 11 has the same configuration as that of the capacitive D/A converter 103 illustrated in FIG. 1. The capacitive D/A converter 11 generates $V_{out}$ (residual signal) for each cycle assigned to each bit of N bits on the basis of an analog input signal Vin and a reference voltage $V_{ref}$.

The two comparators 1 and 2 share the same input, and $V_{out}$ (residual signal) which is the output of the capacitive D/A converter 11 and a ground (Vg) provided as a predetermined voltage are respectively input to the comparators.

The comparator 1 (first comparator) compares $V_{out}$ (residual signal) at a first time point within a cycle with the predetermined voltage (ground), and acquires and outputs a first comparison result representative of a logical value.

The comparator 2 (second comparator) compares $V_{out}$ (residual signal) at a second time point later than the first time point within the abovementioned cycle with the predetermined voltage (ground), and acquires and outputs a second comparison result representative of a logical value.

The output of the comparator 1 is input to the error determining circuit 13 and the register 14. The output of the comparator 2 is input to the error determining circuit 13.

The register 14 stores N signals (N is the resolution of the SARAD converter) output from the comparator 1 in N times.

The register 14 outputs the signals (N-bit data) stored therein to the error-correcting circuit 15.

The error determining circuit 13 determines whether the output (first comparison result) of the comparator 1 and the output (second comparison result) of the comparator 2 are the same. If the two outputs are the same, the error determining circuit 13 sends, to the error-correcting circuit 15, an instruction signal instructing to directly output the data input from the register 14 without correcting the data. On the other hand, if the two outputs differ from each other, the error determining circuit 13 sends, to the error-correcting circuit 15, an instruction signal (error detection signal) instructing to correct the data input from the register 14 to output the corrected data.

According to the content of the instruction signal from the error determining circuit 13, the error-correcting circuit 15 directly outputs the data input from the register without correcting the data, or corrects the data before outputting the data.

The SAR control circuit 16 sends control signals to the capacitive D/A converter 11, the comparators 1 and 2, the register 14, and the error-correcting circuit 15 to control these elements. A control signal to be sent to the SAR control circuit 16 is generated upon receipt of an A/D conversion result from the error-correcting circuit 15. With this control signal, the SAR control circuit 16 controls the capacitive D/A converter 11.

Figure 6:
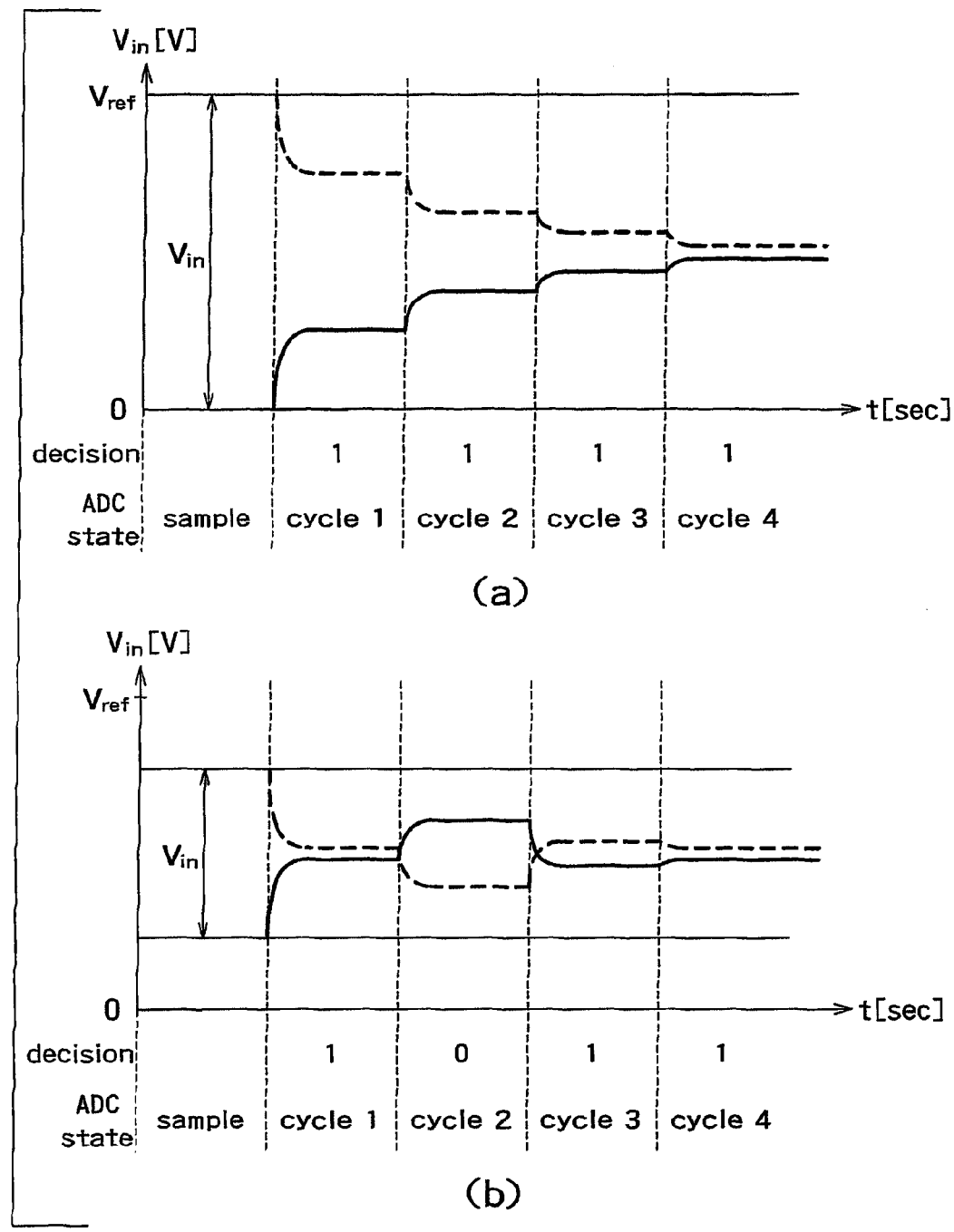
FIG. 6 is a drawing used to describe error correction principles of the SARAD converter.
Figure 7:
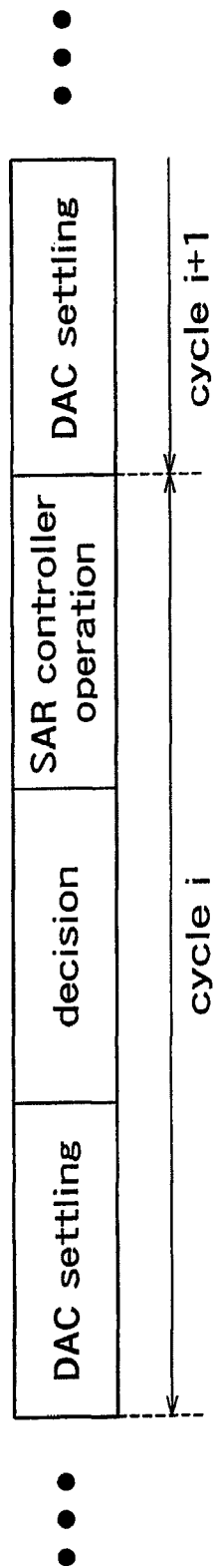
FIG. 7 is a drawing used to describe error correction principles of the SARAD converter.
Figure 8:
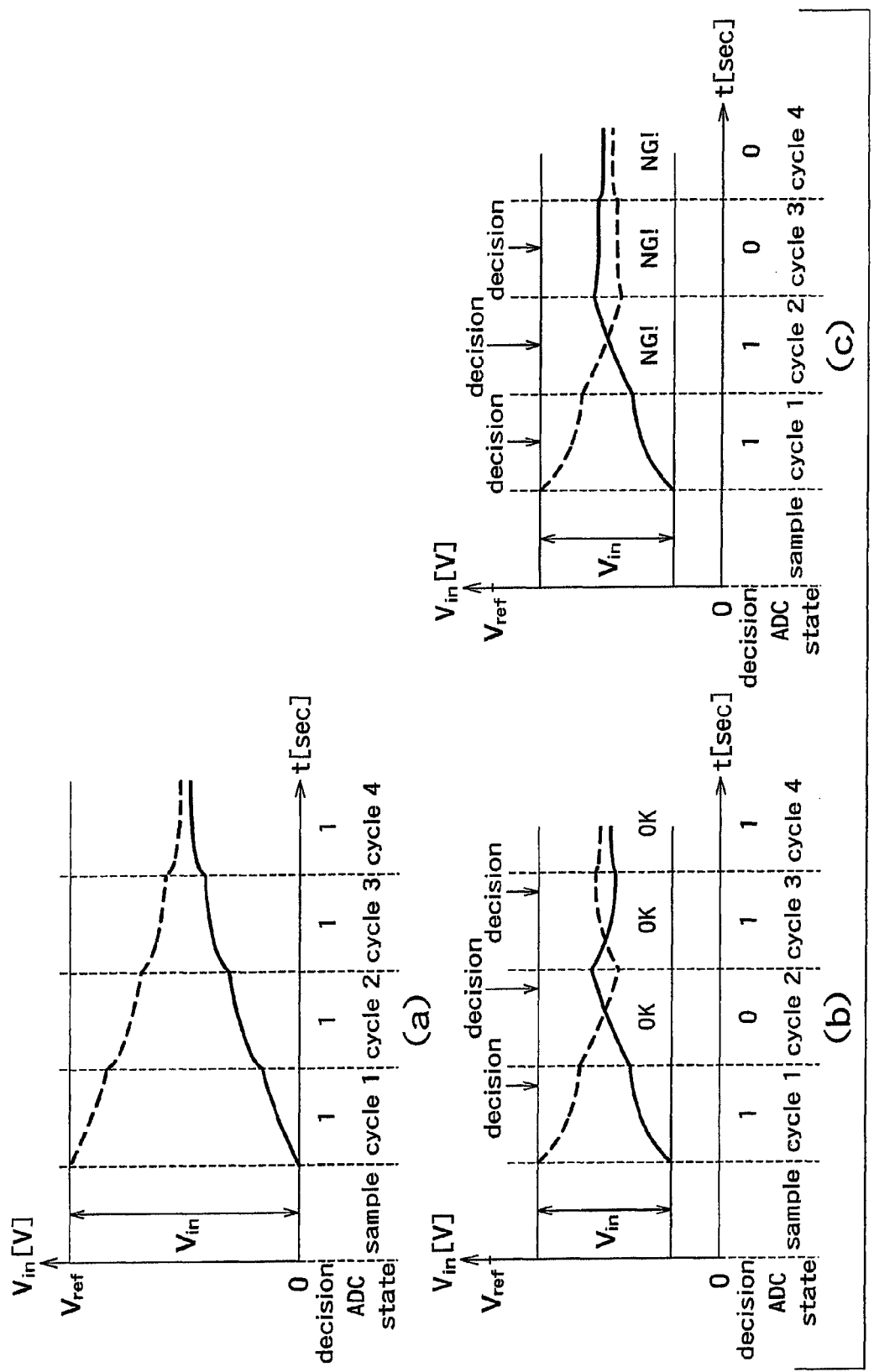
FIG. 8 is a drawing used to describe error correction principles of the SARAD converter.

Specifically, the SAR control circuit 16 generates signals for controlling the switches (see the switches 101a to 101e in FIG. 1) within the capacitive D/A converter 11. The A/D conversion results D[2] and D[1] are required at the time of control. FIGS. 6, 7 and 8 are drawings used to describe error correction principles of the SARAD converter illustrated in FIG. 5.

Principles of error occurrence in a conventional A/D circuit due to insufficient settling will be described first, and then principles of error correction based on a proposed method will be described.

FIG. 6 illustrates time response waveforms of the output signal $V_{out}$ (residual signal) of a capacitive D/A converter in a conventional method. FIG. 6A illustrates a response waveform when an input signal is $V_{ref}$, whereas FIG. 6B illustrates a response waveform when the input signal is approximately ½ $V_{ref}$. In addition, the axis of ordinates in the figure represents voltage and the axis of abscissas represents time.

Output waveforms in the figure assume that the circuit is composed of a full differential circuit. Dashed lines represent a positive-side voltage and solid lines represent a negative-side voltage. Note that a circuit having a single-ended configuration is shown in FIG. 1. In the case of a circuit having a differential configuration, however, the same configuration as that of FIG. 1 is provided on the positive side and the negative side, respectively.

In the figure, $V_{ref}$ denotes a reference voltage of the A/D converter. Note that for reasons of differential configuration, a range of the reference voltage that the positive-side and negative-side configurations can have is $V_{ref}/2$ in FIGS. 6A and $V_{ref}/4$ in FIG. 6B. The term "sample" in the figure refers to the sampling period of an input signal, and "1" and "0" refer to bits obtained as the result of decision. In the illustrated example, four bits are obtained since the resolution N=4.

In the SARAD converter, such a computation as shown earlier in Formula (1) is performed on the input signal. FIGS. 6A and 6B show a case where the settling time of the capacitive D/A converter is sufficiently fast. By making a decision at a time point when a sufficient degree of settling is reached, it is possible to perform successive-approximation A/D conversion without causing errors. When normal conversion operation is done, the differential output voltage of the capacitive D/A converter asymptotically approximates to 0.

FIG. 7 illustrates a timing chart used to describe the operating state of the SARAD converter during a cycle i. As illustrated in the figure, the SARAD converter has roughly three operation phases listed below in one cycle of A/D conversion:

(1) Capacitive D/A converter settling
(2) Comparison (decision)
(3) SAR control circuit operation (generation of control signals for cycles i and i+1)

Comparative operation in phase (2) is normally performed at the completion of settling. Considering the required operating time of the SAR control circuit, comparative operation (decision) is performed about halfway through one cycle. It is conceivable to shorten the settling time or speed up the operation of the SAR control circuit, in order to achieve sufficient settling. Either of these schemes involves the problem, however, that power consumption increases.

FIG. 8 illustrates time response waveforms in a case where the capacitive D/A converter is insufficient in settling.

Like in FIG. 6, a full differential circuit is assumed. FIG. 8A illustrates a case where the input signal is $V_{ref}$, whereas FIGS. 8B and 8C illustrate a case where the input signal is $V_{ref}/2$.

FIGS. 8B and 8C differ from each other in the time point of decision by the comparators. In FIG. 8C, a comparison is made halfway through a cycle, whereas in FIG. 8B, a comparison is made in the final phase of a cycle.

In FIGS. 8A, 8B and 8C, the capacitive D/A converter provides dull time response waveforms since the settling of the capacitive D/A converter is performed simultaneously with a state transition from an ith cycle to an i+/th cycle.

As illustrated in FIG. 8A, the same decision result (output bits equal 1111) as shown in FIG. 6 is brought even in the case of insufficient settling, if the input signal is $V_{ref}$. In contrast, as illustrated in FIGS. 8B and 8C, the decision result varies depending on the timing at which a decision is made, if the input is $V_{ref}/2$. For example, in the case of FIG. 8B in which a comparison is made in the final phase of a cycle, the input signal is A/D-converted (output bits equal 1011) without causing errors under the condition of settling being fully achieved. If a decision by a comparator is made halfway through the cycle, however, an erroneous decision (output bits equal 1100) occurs, as illustrated in FIG. 8C.

Figure 9:
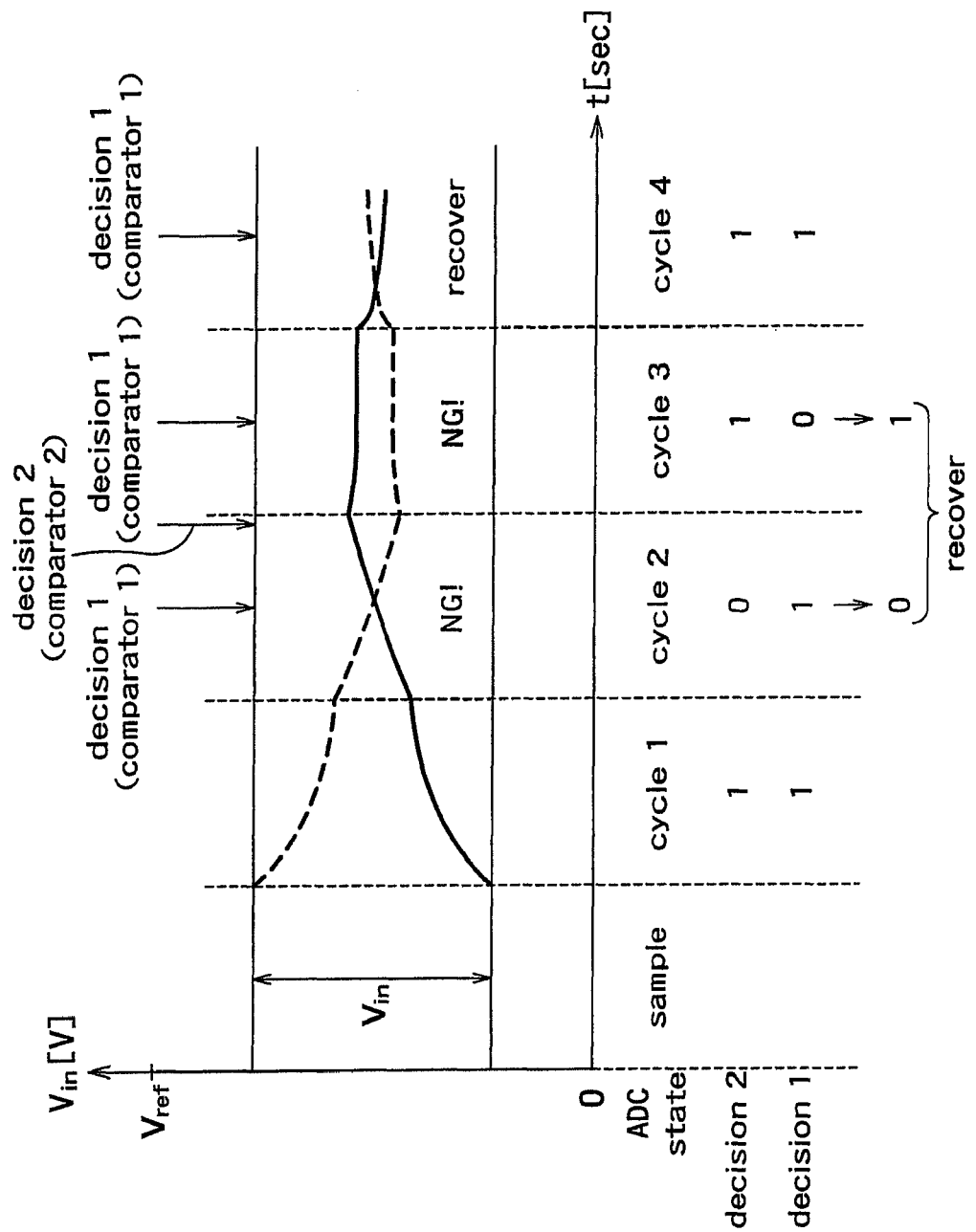
FIG. 9 is a drawing illustrating principles of an error correcting method according to the present embodiment.

FIG. 9 illustrates principles of an error correcting method according to the present embodiment.

This method is characterized in that two points of comparison (first and second time points) are provided in one cycle of an A/D conversion period. As illustrated in FIG. 5, this operation is realized by providing two comparators.

The comparator 1 performs comparative operation near a midpoint in one cycle (first time point) as is done conventionally, whereas the comparator 2 performs comparative operation immediately before the end of one cycle (second time point).

An erroneous decision is detected by comparing the outputs of the comparator 1 and the comparator 2. Identity between the outputs of the two comparators means that the decision of the comparator 1 is normal. Any difference between the outputs of the two comparators means that the decision of the comparator 1 is erroneous.

If the decision of the comparator 1 is erroneous, data (bits) is corrected in a cycle two cycles later than the cycle in which an error has been made. The data correction is made by inverting data of the erroneous cycle and data of the next cycle, respectively. In the example of FIG. 9, data of cycle 2 and cycle 3 is corrected in cycle 4 since an error is detected in cycle 2. Note that the reason for making corrections in a cycle two cycles later than the cycle in which an error has been made is that error correction is limited to this timing due to the operating mechanism of a later-described example of circuit configuration illustrated in FIG. 10.

In the case of a SARAD converter, if an erroneous decision is made in a certain cycle and if the amount of error is not so large, then an error is certainly made in the next cycle. For example, consider a case where an error is made in a first cycle. Here, assume that a time period of a second cycle is sufficiently longer than that of the first cycle. If the input signal is close in value to $V_{ref}/2$ and if an error is made in the first cycle, then a voltage (amount of error) at the time of decision in the second cycle is approximately ¼ $V_{ref}$. If the input signal is $V_{ref}/2+V_{ref}/4$ and if an error is made in the first cycle, then a voltage (amount of error) at the time of decision in the second cycle is approximately 0. Thus, there is the possibility that the decision in the second cycle is correct. Consequently, it can be said that data correction is possible if the amount of error in an ith cycle is equal to or smaller than a subtracted amount of reference voltage in an i+ith cycle.

Error-correcting operation is restarted from the same cycle as the one in which an error correction has been made (i.e., cycle 4 in FIG. 9, since an error correction is made in cycle 4). The settling time of the capacitive D/A converter is relaxed as the number of conversion cycles increases. This is because capacitors being dealt with by the capacitive D/A converter decrease in value for each subsequent conversion cycle (in the example of FIG. 1, the capacitors decrease in value in the order of $\alpha^3 C$, $\alpha^2 C$, $\alpha^1 C$, $\alpha^0 C$ and $\alpha^0 C$) and, accordingly, the load of a driver for driving the capacitive D/A converter is also alleviated. In the example of FIG. 1, the settling time problem of the capacitive D/A converter is generally fixed by the time an LSB conversion cycle begins.

By the above-described operation, it is possible, in this proposed method, to relax the settling time of the capacitive D/A converter without giving rise to conventionally problematic extra conversion cycles, while maintaining a conversion algorithm in binary code format. In addition, there is no need for any extra digital signal processing circuits to be used after A/D conversion, since the binary code format is still maintained.

Figure 10:
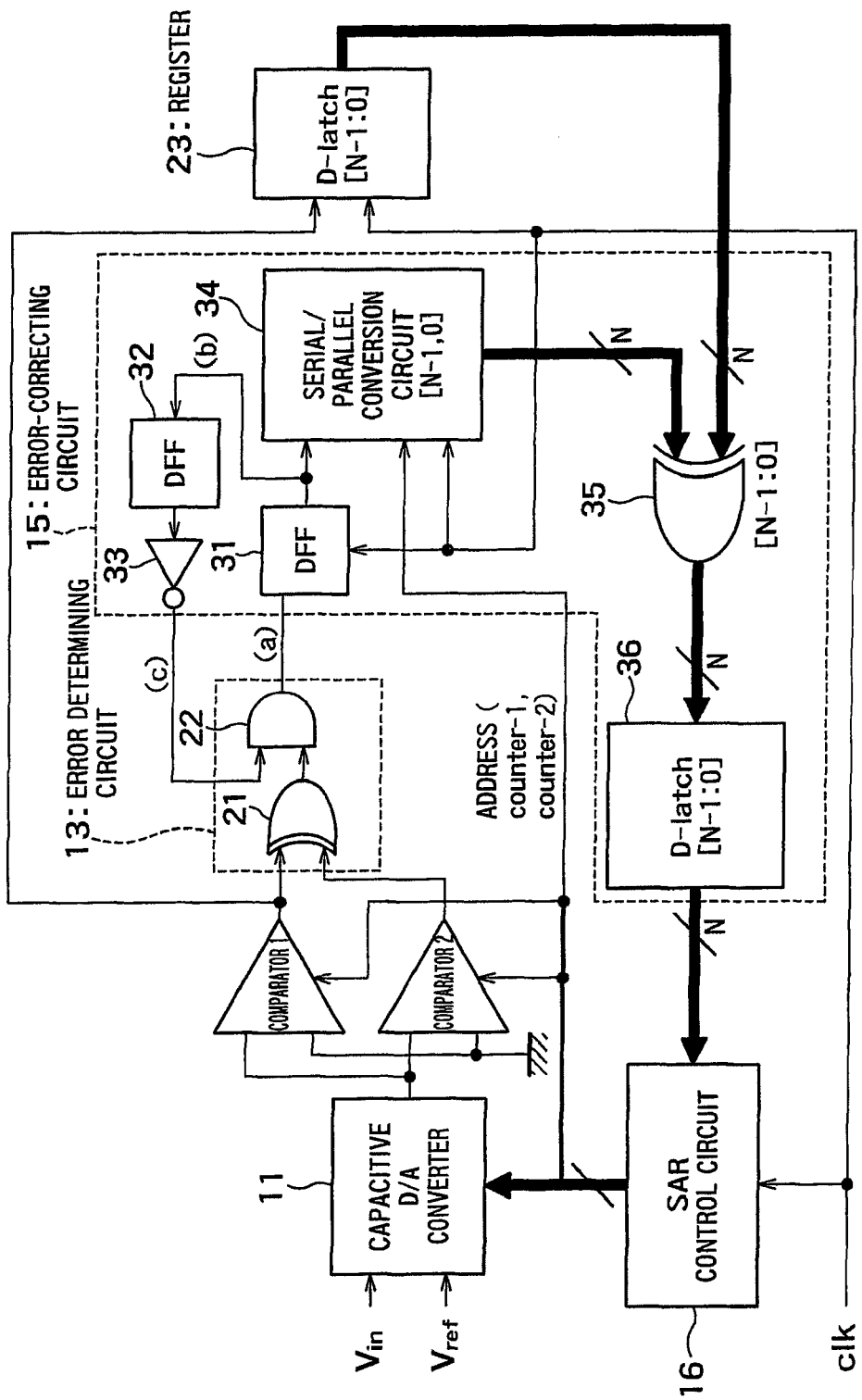
FIG. 10 is a drawing illustrating a specific configuration example of the circuit illustrated in FIG. 5.
Figure 11:
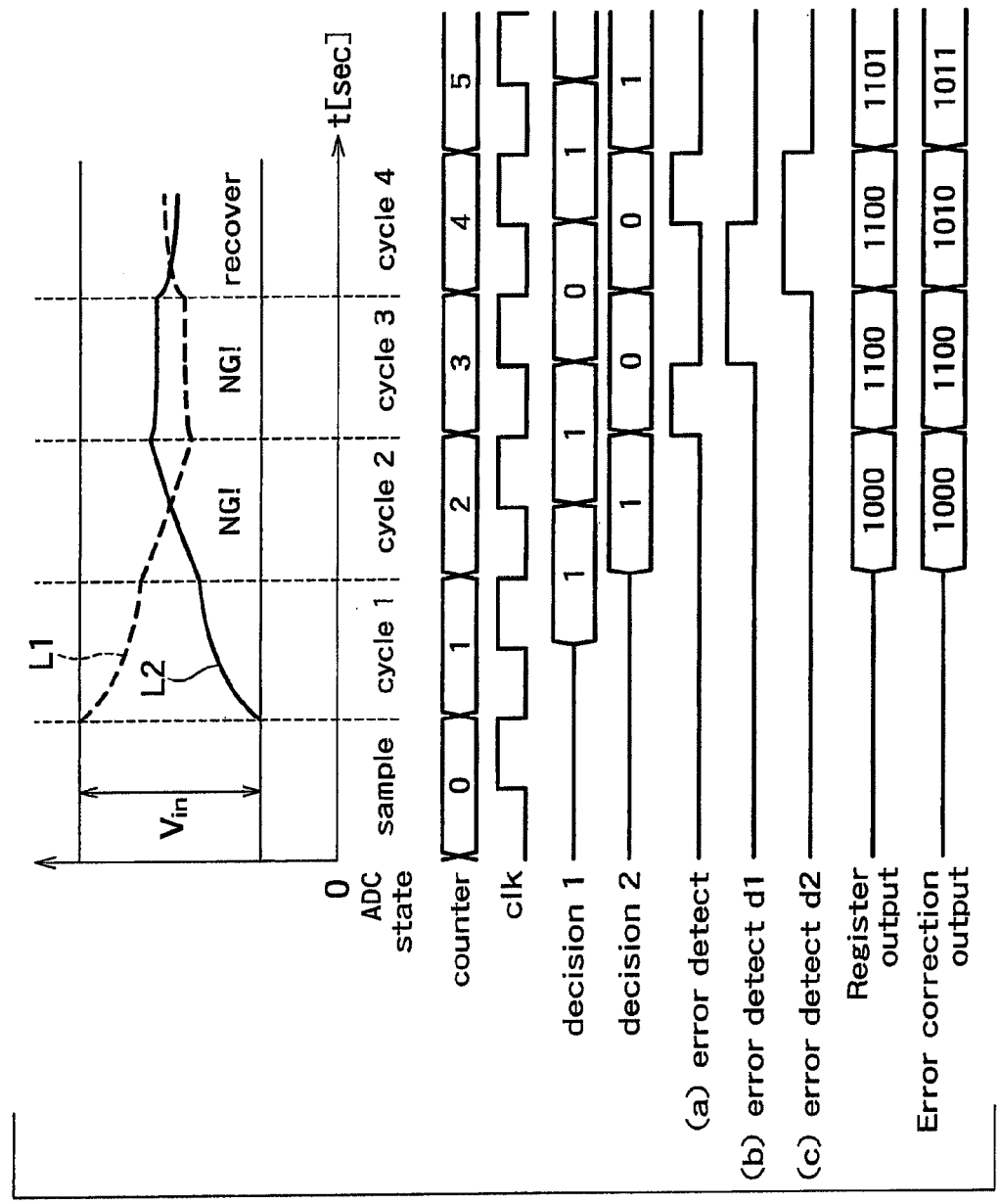
FIG. 11 is a drawing illustrating a timing chart of operation of the circuit illustrated in FIG. 10.

FIG. 10 illustrates a specific configuration example of the circuit shown in FIG. 5. FIG. 11 illustrates a timing chart of FIG. 10. Output waveforms in the figure assume that the circuit is composed of a full differential circuit, where a dashed line L1 represents a positive-side voltage and a solid line L2 represents a negative-side voltage. Here, an example is shown in which an analog signal having the bits "1011" is A/D-converted. In FIG. 11, the term "counter" represents a counter value and the symbol "clk" represents a clock. The term "decision 1" represents the output of a comparator 1 and the term "decision 2" represents the output of a comparator 2. The phrases (a) error detect, (b) error detect_d1, and (c) error detect_d2 correspond to the output of an AND circuit 22, the output of a DFF 31, and the output of a NOT circuit 33, respectively, as illustrated in FIG. 10. The phrase "register output" corresponds to the output of a register (D-latch) 23, and the phrase "error correction output" corresponds to the output of an error-correcting circuit 15.

An error determining circuit 13 is composed of an EXOR circuit 21 and the AND circuit 22. The error-correcting circuit 15 is composed of two DFFs 31 and 32, a NOT circuit 33, a serial/parallel conversion circuit 34, N EXORs 35, and N DFFs (D latches) 36. A register 14 is composed of the D latch 23.

The basic operation of this circuit is to invert the output data of the register only for the parts thereof in which erroneous decisions have been made, by using the XOR circuit 35.

In order to invert bit information of a cycle in which a decision error is detected and of the next cycle, respectively, "1" which means error detection is written to the bits in question by using the serial/parallel conversion circuit 34. Address signals are used when the output of the DFF 31 is written to the serial/parallel conversion circuit 34. A counter value k within an SAR at the time of sampling is 0, as illustrated in FIG. 11, and increases thereafter in increments of 1 for each subsequent cycle. The address signals are represented by "k–1" and "k–2". The address signals (two) are used only in an error-correcting cycle. The address signals vary along with the counter value k, and the values of the address signals are only effective in the error-correcting cycle (cycle 4 in the example of FIG. 11). In the example of FIG. 11, the counter value of cycle 4 in which an error correction has been made is 4, and therefore, the two address signals show 4–1=3 and 4–2=2, respectively. This means that bits having these values (i.e., higher-order second and third bits) are corrected.

The comparators 1 and 2, output "1" or "0" by referring to a polarity obtained from a positive-side signal shown by a line L1 and a negative-side signal shown by a line L2. If the line L1 is positioned above the line L2, the comparators output "1". Otherwise, the comparators output "0". The comparators 1 and 2 share the same input signal. Consequently, a decision made by the comparator 1 in cycle 2 is "1", and "0" in cycle 3.

A decision made by the comparator 2 in cycle 2 is "0", and "0" in cycle 3. As described earlier, if in a successive-approximation A/D converter, an erroneous decision is made in a certain cycle, then an error is certainly made in the next cycle. Also from this premise, it can be said that the comparators 1 and 2 differ in decision result from each other in cycle 2, and agree in decision result with each other in cycle 3.

As has been described heretofore, in the present embodiment, the SARAD converter includes two comparators so as to make decisions individually at different time points within one cycle. An error caused due to incomplete settling is detected by using two comparison results, and data is corrected in a cycle following a cycle in which the error has been made. Consequently, A/D conversion operation can be performed without causing errors even in the case of a binary weighted capacitive DAC, as long as incomplete settling errors are limited to a certain degree. Accordingly, the present embodiment is effective in reducing the power consumption of a driver for driving the capacitive D/A converter.

Figure 12:
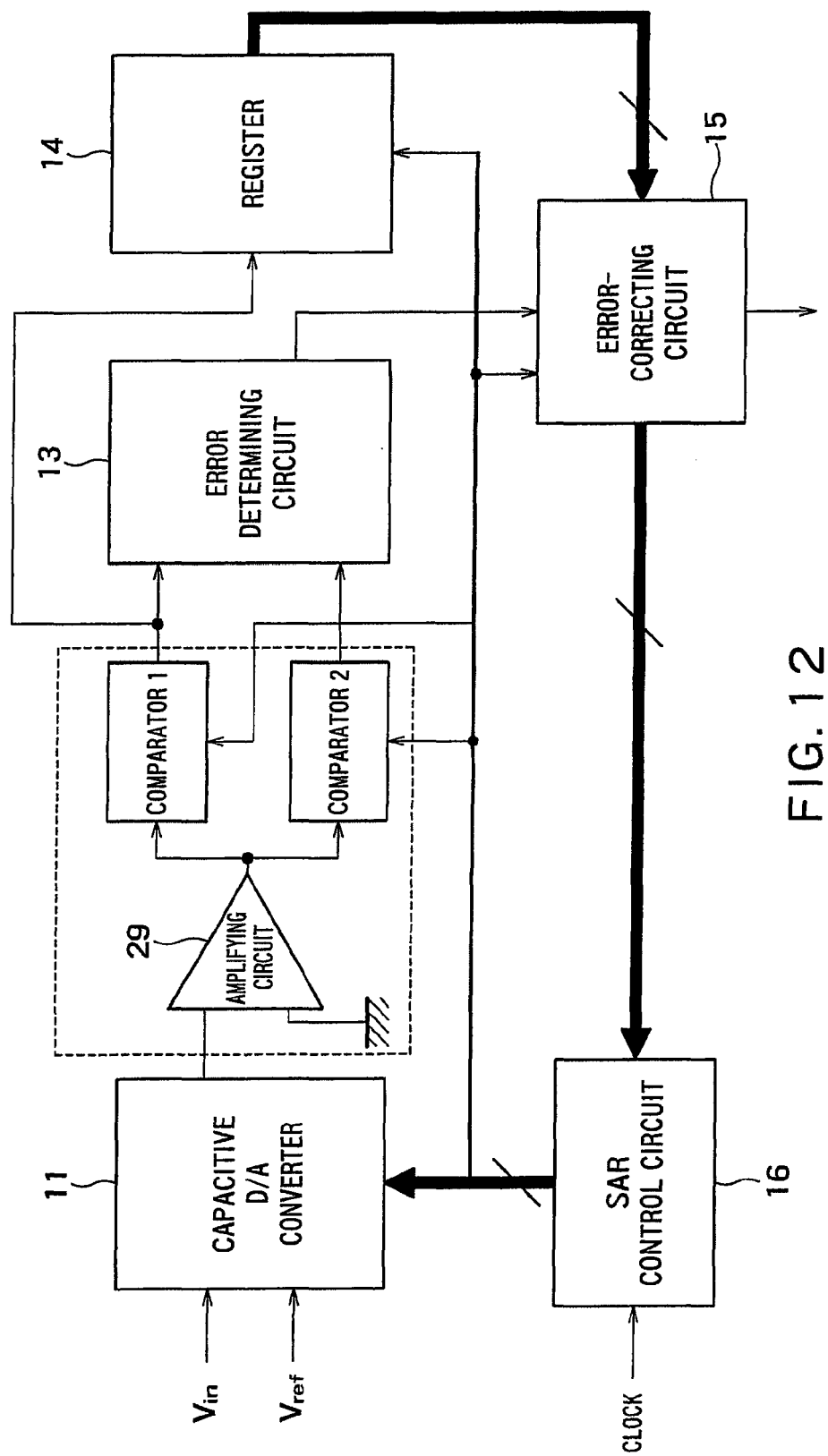
FIG. 12 is a drawing illustrating a SARAD conversion circuit according to a second embodiment.

FIG. 12 illustrates a SARAD conversion circuit according to a second embodiment.

The basic configuration of the circuit illustrated in FIG. 12 is the same as that of the first embodiment, except that the second embodiment differs from the first embodiment in the circuit configuration of comparators.

In the present embodiment, part of the circuitry of the two comparators in the first embodiment is shared to reduce power consumption and a circuit area. Specifically, amplifying circuits within the two comparators of the first embodiment are reduced to one amplifying circuit for shared use by the two comparators.

In general, an amplifying circuit 29 is provided in a stage followed by comparison circuits (comparators) 1 and 2, in order to alleviate effects of noise (kickback) due to latching operation upon the output of the capacitive D/A converter. Effects of impedance conversion by this amplifying circuit 29 produce improvement against the kickback noise. In addition, the effect of signal amplification by the amplifying circuit 29 produces the effect of reducing noise of the comparison circuits (comparators) 1 and 2 as viewed from a D/A convertor output. Note that although a single-ended configuration is illustrated in FIG. 12 for convenience of description, the same effect can be obtained with a full differential configuration.

As has been described heretofore, according to the present embodiment, power consumption can be reduced by sharing the amplifying circuit 29 between the two comparators. Note that the reason for providing the two comparators is that two circuits are necessary to retain comparison results.

Figure 13:
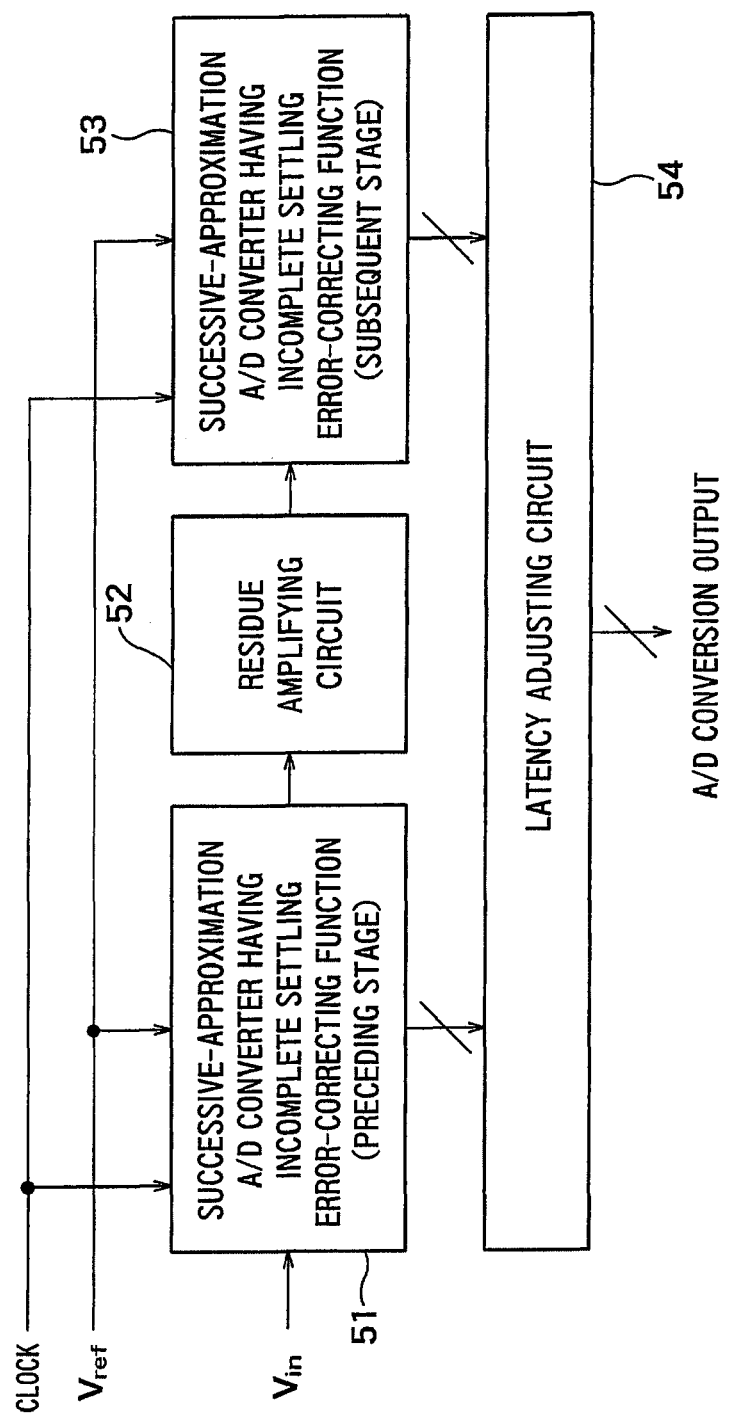
FIG. 13 is a drawing illustrating a SARAD conversion circuit according to a third embodiment.

FIG. 13 illustrates a SARAD conversion circuit according to a third embodiment.

This circuit is a pipelining SARAD converter configured by using the circuit of the first or second embodiment.

This circuit is provided with a preceding-stage circuit 51, a residue amplifying circuit 52, a subsequent-stage circuit 53, and a latency adjusting circuit 54.

The preceding-stage circuit 51 has an error-correcting function proposed in the first and second embodiments, and is a successive-approximation A/D converter configured to perform coarse A/D conversion (process higher-order n1 bits by the preceding-stage circuit if the resolution of this circuit is N bits) on input signals. In addition, the preceding-stage circuit 51 generates a residual signal according to an input analog signal and a reference voltage, and outputs the residual signal to the residue amplifying circuit 51. For example, the preceding-stage circuit 51 generates a $Vin-V_{ref}/2$ signal as the residual signal.

The residue amplifying circuit 51 amplifies and outputs the residual signal to the subsequent-stage circuit 53. By the amplification, the input range of the subsequent-stage circuit 53 is adjusted to that of the preceding-stage circuit 51.

The subsequent-stage circuit 53 receives the amplified residual signal as the input thereof, and performs fine A/D conversion (processes remaining lower-order n2 (=N-n1) bits) on the input signal. The subsequent-stage circuit 53 is also a successive approximation A/D conversion circuit having the error-correcting function proposed in the first and second embodiments.

The latency adjusting circuit 54 makes a timing adjustment of A/D conversion results obtained by the preceding-stage circuit 51 and the subsequent-stage circuit 53, and output the results.

By pipelining A/D conversion processing as described above, it is possible to achieve an effect of area reduction and easily make a resolution higher, compared with the first and second embodiments.

As has been described heretofore, according to the present embodiment, a high-resolution A/D converter can be designed with a reduced area by pipelining a circuit according to the first or second embodiment. In addition, pipelining enables performance to be improved easily, compared with the configuration of the first or second embodiment.

Figure 14:
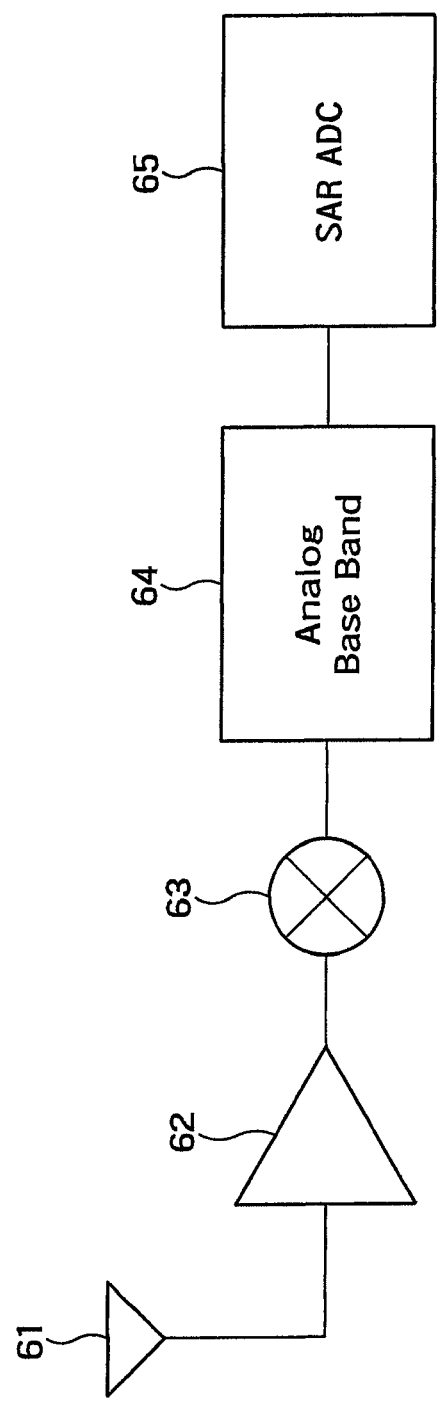
FIG. 14 is a drawing illustrating a radio receiver provided with a SARAD conversion circuit according to any one of the first to third embodiments.

FIG. 14 illustrates a radio receiver provided with a SARAD conversion circuit according to the first, second or third embodiment.

This radio receiver is provided with an antenna 61, an LNA 62, a mixer 63, an analog baseband circuit 64, and a SARAD conversion circuit 65.

A radio signal received by the antenna 61 is amplified by the LNA (Low Noise Amplifier) 62. The radio-frequency signal amplified by the LNA 62 is down-converted to a baseband signal by the mixer 63, and the baseband signal is filter-processed by the analog baseband circuit 64, thereby deriving a signal of a desired band. Then, the filtered analog signal is converted to a digital signal by the SARAD conversion circuit 65. The digital signal is demodulation-processed by an unillustrated subsequent-stage circuit.

The present invention is not limited to the exact embodiments described above and can be embodied with its components modified in an implementation phase without departing from the scope of the invention. Also, arbitrary combinations of the components disclosed in the above-described embodiments can form various inventions. For example, some of the all components shown in the embodiments may be omitted. Furthermore, components from different embodiments may be combined as appropriate.

The invention claimed is:

1. A successive-approximation A/D converter, comprising:
    a binary weighted capacitive D/A converter configured to generate a residual signal for each of cycles assigned to each bit of N bits on the basis of an analog input signal and a reference voltage;
    a first comparator configured to compare a residual signal at a first time point within a cycle with a predetermined voltage to acquire a first comparison result representative of a logical value;
    a register configured to store the first comparison result therein;
    a second comparator configured to compare a residual signal at a second time point later than the first time point within the cycle with the predetermined voltage to acquire a second comparison result representative of a logical value;
    an error determining circuit configured to generate an error detection signal when the first comparison result differs from the second comparison result; and
    an error-correcting circuit configured to invert, in a case that the error detection signal has been generated, the first comparison result from the register to output an inverted first comparison result, and output, in a case that the error detection signal has not been generated, the first comparison result from the register, without inverting the first comparison result.

2. The converter according to claim 1, wherein the error-correcting circuit inverts the first comparison result acquired at a cycle following the cycle at which the error detection signal is generated.

3. The converter according to claim 1, further comprising an amplifier configured to amplify the residual signal, wherein the first comparator compares the residual signal amplified by the amplifier with the predetermined voltage, and the second comparator compares the residual signal amplified by the amplifier with the predetermined voltage.

4. A pipelining successive-approximation A/D converter comprising:
    first and second successive-approximation A/D converters according to claim 1;
    a residue amplifying circuit; and
    a latency adjusting circuit,
    wherein
        the first successive-approximation A/D converter outputs first comparison results corresponding to higher-order n1 bits of the N bits and generates a first residual signal based on the analog input signal and the reference voltage, the residue amplifying circuit amplifies the first residual signal, the second successive-approximation A/D converter outputs first comparison results corresponding to lower-order N −n1 bits of the N bits on the basis of the reference voltage and the amplified first residual signal used as the analog input signal, and the latency adjusting circuit combines the first comparison results output from the first successive-approximation A/D converter and the first comparison results output from the second successive-approximation A/D converter, to obtain A/D conversion data.

5. A radio receiver comprising:
an antenna configured to receive a radio signal;
an amplifier configured to amplify the radio signal received by the antenna;
a mixer configured to convert the radio signal amplified by the amplifier to a baseband signal;
an analog baseband unit configured to filter-process the baseband signal; and
a successive-approximation A/D converter or a pipelining successive-approximation A/D converter according to claim 1 to A/D-convert the filter-processed baseband signal.

6. A radio receiver comprising:
an antenna configured to receive a radio signal;
an amplifier configured to amplify the radio signal received by the antenna;
a mixer configured to convert the radio signal amplified by the amplifier to a baseband signal;
an analog baseband unit configured to filter-process the baseband signal; and
a successive-approximation A/D converter or a pipelining successive-approximation A/D converter according to claim 2 to A/D-convert the filter-processed baseband signal.

7. A radio receiver comprising:
an antenna configured to receive a radio signal;
an amplifier configured to amplify the radio signal received by the antenna;
a mixer configured to convert the radio signal amplified by the amplifier to a baseband signal;
an analog baseband unit configured to filter-process the baseband signal; and
a successive-approximation A/D converter or a pipelining successive-approximation A/D converter according to claim 3 to A/D-convert the filter-processed baseband signal.

8. A radio receiver comprising:
an antenna configured to receive a radio signal;
an amplifier configured to amplify the radio signal received by the antenna;
a mixer configured to convert the radio signal amplified by the amplifier to a baseband signal;
an analog baseband unit configured to filter-process the baseband signal; and
a successive-approximation A/D converter or a pipelining successive-approximation A/D converter according to claim 4 to A/D-convert the filter-processed baseband signal.

* * * * *